United States Patent [19]
Wada et al.

[11] 4,360,920
[45] Nov. 23, 1982

[54] TERRACED SUBSTRATE SEMICONDUCTOR LASER

[75] Inventors: Masaru Wada, Takatsuki; Hirokazu Shimizu, Toyonaka; Takashi Sugino, Takatsuki; Kunio Itoh, Uji, all of Japan

[73] Assignee: Matsushita Electric Industrial Co., Ltd., Kadoma, Japan

[21] Appl. No.: 185,922

[22] Filed: Sep. 10, 1980

[30] Foreign Application Priority Data

Sep. 18, 1979 [JP] Japan .................................. 54-119891

[51] Int. Cl.³ .............................................. H01S 3/19
[52] U.S. Cl. ...................................... 372/45; 357/17; 372/46
[58] Field of Search .................... 331/94.5 H; 357/17, 357/18; 372/45, 46

[56] References Cited
U.S. PATENT DOCUMENTS
4,296,387 10/1981 Sugino et al. .................. 331/94.5 H FOREIGN PATENT DOCUMENTS
107284 8/1979 Japan .......................... 331/94.5 H Primary Examiner—James W. Davie
Attorney, Agent, or Firm—Cushman, Darby & Cushman

[57] ABSTRACT

In a semiconductor laser a semiconductor substrate has a terrace structure in a manner to have an upper face, a lower face, and a step part disposed between the upper and lower faces. A clad layer is formed on the semiconductor substrate having an upper part, a lower part, and a central part. The upper part is on the upper face and the step part. The lower part is on the lower face and the central part connecting the upper and lower parts and is thicker than the upper and lower parts in a manner that a step-shaped downward-bending surface of the central part is located above the lower face. An active layer formed on the clad layer includes an upper lateral part, a lower lateral part, a center part connecting the upper and lower lateral parts, with a lasing region being a part of the upper lateral part which is near a bending part of the step-shaped downward-bending surface.

4 Claims, 12 Drawing Figures

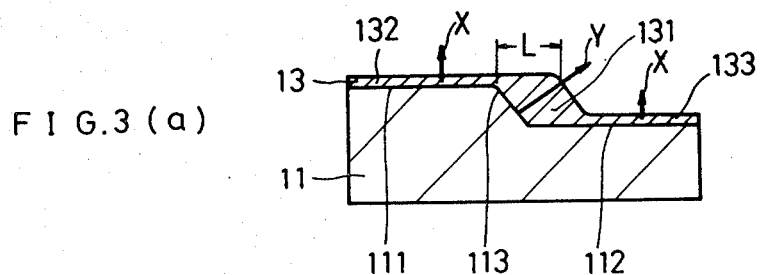
FIG. 3(a)
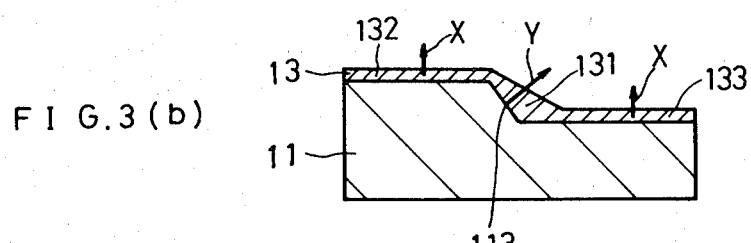
FIG. 3(b)
FIG. 4
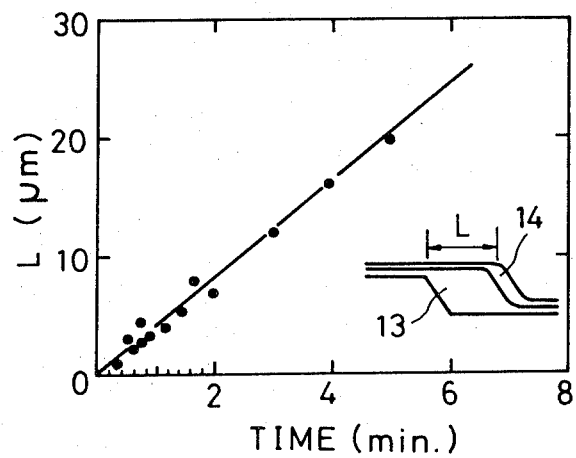

TERRACED SUBSTRATE SEMICONDUCTOR LASER

BACKGROUND OF THE INVENTION

1. Field of the Invention

The present invention relates to an improvement in a semiconductor laser. Especially the present invention relates to a semiconductor laser made by a liquid phase epitaxial growth method.

2. Prior Art

Together with remarkable progress of light communication technology and disk type video recording technology, semiconductor lasers are regarded as most important devices to serve as light sources to be used in such technologies. Accordingly, there are great requirements on reliability and performance of such semiconductor lasers. That is, lasers of longer lifetime and lasing with more stable fundamental mode are required.

Various types of lasers have been hitherto developed, and a terraced substrate structure type has been also proposed in the U.S. patent application Ser. No. 40,182, now U.S. Pat. No. 4,296,387. FIG. 1 shows the structure of the terraced substrate structure type laser which comprises the following parts:

a substrate 1 of: $n^+$-GaAs,
a first clad layer 3 of: $n$-$Ga_{1-x}Al_xAs$,
an active layer 4 of: non-doped $Ga_{1-y}Al_yAs$,
a second clad layer 5 of: $p$-$Ga_{1-z}Al_zAs$,
a contacting layer 6 of: p-GaAs, and
a hetero-isolation layer 7 of: $n$-$Ga_{0.5}Al_{0.5}As$.

The layers 3, 4, 5, 6 and 7 are formed by sequential epitaxial growths on the substrate 1, which is formed in a terrace shape having a step part 101. Therein the first clad layer 3 has a triangular part 301 at the step part 101, and accordingly the active layer 4 is shaped on the triangular part 301, so as to have an oblique lasing region 8 defined between a higher bending portion 81 and a lower bending portion 82. In this structure, the thickness of the first clad layer 3 under the lasing region 8 is thicker than those under other parts of the active layer 4, and hence beam divergence measured in a plane perpendicular to a junction between the active layer 4 and the second clad layer 5 is small. That is, the triangular part of the first clad layer 3 at the thickest part is about 1 $\mu$m thick, and a lower horizontal part and an upper horizontal part of the first clad layer 3 is 0.3 $\mu$m thick. Therefore, the emission in the active layer 4 on the upper or lower horizontal part is absorbed by the substrate 1, while the emission in the lasing region 8 on 1 $\mu$m thick triangular region 301 is not absorbed by the substrate 1 and makes a single spot lasing. Furthermore, the lasing region 8 is about 20% thicker than the horizontal parts, forming as a result a folded ridge type light waveguide, wherein effective refractive index is higher in the bent parts, resulting in further stability of lasing mode.

However, the laser of FIG. 1 has a problem that the lasing region 8 is disposed oblique to the horizontal upper face and lower face which are of (100) plane of the substrate 1, and accordingly the crystal of the lasing region is likely to be imperfect, thereby reducing lasing yield. Furthermore, the lower bending portion 82 is liable to obscurity, which leads to insufficiency of lasing light and resultant poor convergency of light in a plane perpendicular to the junction plane. Therefore, lasing in a fundamental mode of circular beam divergence is difficult.

SUMMARY OF THE INVENTION

The present invention can provide a semiconductor laser capable of stable performance of fundamental mode lasing.

The present invention also can provide a semiconductor laser with a high yield of lasing.

BRIEF EXPLANATION OF THE DRAWINGS

FIG. 3(a) and FIG. 3(b) are sectional elevation views illustrating mode of growths of clad layers in a semiconductor laser in different conditions.

FIG. 4 is a graph showing relation between time of growth and width L of the lasing region of a semiconductor laser in accordance with the present invention.

DESCRIPTION OF THE PREFERRED EMBODIMENT

A semiconductor laser in accordance with the present invention comprises a terrace-shaped semiconductor substrate having an upper face, a lower face and a step part disposed between said upper face and said lower face, a clad layer formed on said substrate and including an upper part, a lower part and a central part disposed between said upper part and said lower part, said upper part being on said upper face, said lower part being on said lower face, and said central part being on said lower face and on said step part and being thicker than said upper part and said lower part in a manner that the surface of said upper part of said clad layer extends flat to a position above said lower face and ends with a step-shaped downwards bending to said lower surface, an active layer formed on said first clad layer in a manner to include a bending part on said step-shaped downwards bending portion and a flat part extending therefrom towards on said upper part, the part of said flat part which is near said bending part including a lasing region, and a current injection electrode disposed above said lasing region.

Figure 2E:
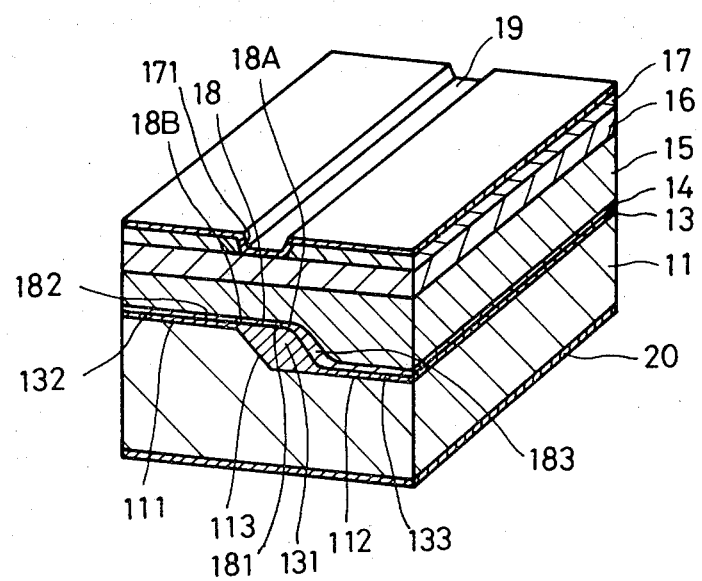
FIG. 2(e) is a perspective view showing a semiconductor laser manufactured in accordance with the present invention.
Figure 2A:
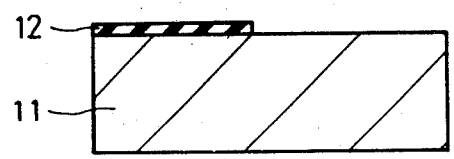
FIG. 2(a), FIG. 2(b), FIG. 2(c) and FIG. 2(d) are sectional elevation views elucidating steps of making a semiconductor laser embodying the present invention.

A preferred embodiment is elucidated with reference to the accompanying drawings FIG. 2(a) and thereafter.

FIG. 2(a), FIG. 2(b), FIG. 2(c), FIG. 2(d) and FIG. 2(e) show steps of manufacturing a semiconductor laser embodying the present invention.

Figure 2B:
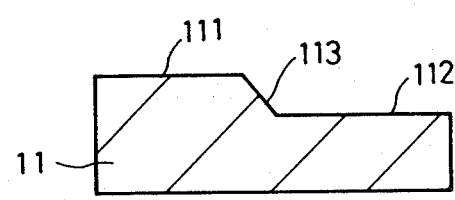

As shown in FIG. 2(a), a known photoresist film 12 of a stripe-shaped pattern, for example, of 250 $\mu$m pitches and 125 $\mu$m openings is formed on a n-type single crystalline GaAs substrate 11 in a manner that the stripe pattern is perpendicular to the (110) cleaved face. Then, a chemical etching is carried out, by utilizing said stripe-shaped photoresist film as a mask by using a known reaction-determining etchant of $H_2SO_4+H_2O_2+H_2O$, thereby to etch to the depth of 1.2 μm, thereby to form the terrace-shaped substrate 11 as shown by FIG. 2(b). The upper face 111 and the lower face 112 of the substrate 11 are (100) plane and the step face 113 connecting the upper face 111 and the lower face 112 is (011) plane.

Then a double heterostructure is formed by liquid phase epitaxial growths on this substrate 11, by using, for example, a known slide boat. Therein, the manner of growth much varies depending on the initial supercooling of Ga-solution for the liquid phase epitaxial growth. The smaller the initial supercooling is, then the greater then growth rate difference between the part on the step part 113 and the parts on the horizontal upper face 111 and lower face 112. FIG. 3(a) and FIG. 3(b) comparatively show a difference of growth rate for the cases for a smaller initial supercooling and a larger initial supercooling, respectively, of the growth solution. FIG. 3(a) shows a case where an n-$Ga_{1-x}Al_xAs$ clad layer 13 is grown on the substrate 11 from a solution of 0° C. of initial supercooling; and FIG. 3(b) shows another case where an n-$Ga_{1-x}Al_xAs$ clad layer 13 is grown on the substrate 11 from a solution of 3° C. of initial supercooling, and the structure of the clad layer 13 of FIG. 3(b) is substantially the same as that of FIG. 1. (The abovementioned 0° C. or 3° C. of initial supercooling means the temperature difference between an initial temperature of crystal growth and a temperature of growth starting. Thus, when the initial temperature is 800° C., the 3° C. of the initial supercooling means that the growth is made at 797° C.) The lower the initial supercooling is (i.e., the higher the solution temperature is), the larger the growth on the step face, especially to the <011> direction indicated by the arrow Y in comparison with that on <100> direction shown by the arrow X becomes. The reason for such phenomena is that spatial distribution of As concentration is produced at the vicinity of the face of the step part, and diffusion of As from the surrounding part increases growth in <011> direction. The clad layer 13 of the present invention is thus formed in a manner to have a central part 131 which has a certain width L, that can be controlled by means of controlling the initial supercooling, and also by the time length of growth as shown by a time vs. growth width L graph of FIG. 4. Therefore, the clad layer 13 is formed to have an upper part 132 disposed on the upper face 111 of the substrate 11, a lower part 133 disposed on the lower face 112 of the substrate 11 and a central part 131 disposed on the lower face 112 and on the step face 113. The central part 131 has a very large thickness, that is identical to that of the height of the step 113 and has a surface flatly extending from the upper part 132 to a position above the lower part 133 and ends with a step-shaped downwards bending 18A of the surface on the abovementioned position.

Figure 2C:
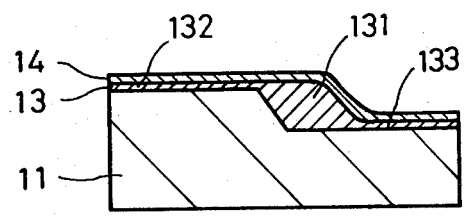
Figure 2D:
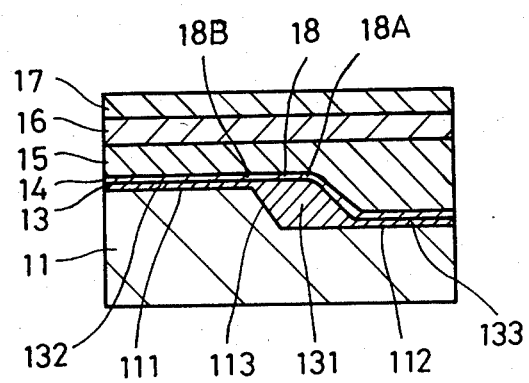

The clad layer 13 of n-$Ga_{1-x}Al_xAs$ doped with Sn or Te is formed by a liquid phase epitaxial growth from an exactly saturated Ga-solution of initial temperature of 800° C. in a manner that thickness of the upper part 132 and the lower part 133 are under 0.3 μm. Then, on the clad layer 13 is formed an active layer 14 of undoped $Ga_{1-y}Al_yAs$ of for example 0.1 μm, as shown by FIG. 2(c). Then, on the active layer 14, the following layers are further formed:

a second clad layer 15 of: p-$Ga_{1-z}Al_zAs$ (Ge-doped),
a contacting layer 16 of: p-GaAs (Ge-doped) and
a hetero-isolation layer 17 of: n-$Ga_{0.5}Al_{0.5}As$ (Sn-doped).

The fractions x, y and z are, for example, 0.3, 0.05 and 0.5 for an infrared laser.

The hetero-isolation layer 17 can be replaced by an insulation layer of oxide film or the like one formed by CVD or sputtering method.

Then by means of a known photo-etching method a stripe shape opening 171 of, for example, 5 μm width is formed in the isolation layer 17 at the part above the central part 131 above which part the active layer 14 works as a lasing region 18. Therefore, the underlying contacting layer 16 is exposed from the stripe-shaped opening. Then, an additional diffusion of Zn is made onto the exposed surface part of the contacting layer 16 through the opening, thereby forming a $p^+$-layer. Finally, a p-side electrode 19 is formed by vacuum deposition of Ti-Pt-Au. After etching the bottom face of the wafer to the total thickness of about 100 μm, an n-side electrode 20 is formed by vacuum deposition of Au-Ge-Ni as shown by FIG. 2(e).

Figure 1:
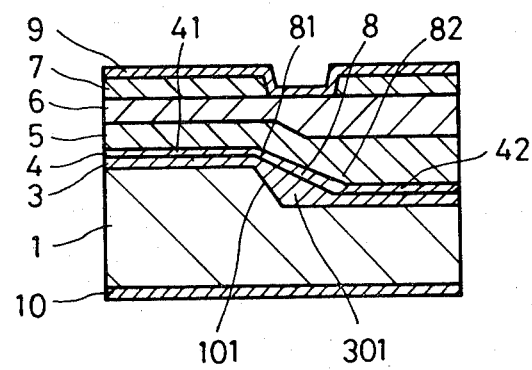
FIG. 1 is a sectional elevation view of a prior proposed terrace structure semiconductor laser.

The laser of FIG. 2(e) manufactured in accordance with the present invention is greatly different from the prior proposed laser of FIG. 1 in the shape and position of the lasing region. That is, in the prior proposed semiconductor laser, the lasing region 8 is the oblique region connecting the upper part 41 of the active layer 4 and the lower part 42 of the active layer 4, and both ends of the stripe-shaped lasing region 8 are defined by the upper bending portion 81 and lower bending portion. Such inclined lasing region 8 has the first problem of the crystal imperfection as has been aforementioned and the second problem that the lower bending portion is liable to be not sharp. On the contrary to such prior proposed structure of FIG. 1, the laser of FIG. 2(e) in accordance with the present invention has the lasing region 18 disposed horizontally on a horizontal surface of the central part 131 of the first clad layer 13. That is, the lasing region 18 is sharply defined between a first end, which is the bending part 18A at which the horizontal part 181 and oblique part 183 of the active layer 14 is connected, and a second end 18B which is above the boundary part between the thin flat upper part 132 of the clad layer 13 and the thick central part 131 of the clad layer 13. A current injected from the stripe-shaped p-side electrode 19, which is above the lasing region 18, flows down and flows in the horizontal lasing region 18. Since the left part of the active layer 14 which is beyond said second end 18B is disposed on the thin upper part 132 of the first clad layer 13, light in such left part of the active layer 14 is easily absorbed by the substrate 11 at its upper face 111. And since the first end 18A of the lasing region 18 is the sharp bending of the active layer 14, the first end 18A serves to confine the light in the lasing region without diffusing out towards the oblique part 183 of the active layer 14. Furthermore, since the oblique part 183 is thicker than the lasing region 18, it is difficult to oscillate in the oblique part 183. Thus the light is easily and effectively confined in the lasing region 18 between the first end 18A and the second end 18B, and the width L of the lasing region 18 can be controlled by controlling the conditions of the epitaxial growth of the first clad layer 13. When the Ga-solution to produce the first clad layer 13 is an exactly saturated solution, and the initial supercooling is selected to be very small, then the upper surface of the clad layer 13 is formed in a manner to flatly extend from the upper part to the position on the lower face of the substrate, accordingly assuring a predetermined width L of the lasing region 18 in the active layer 14.

Furthermore, it is easily realizable that the lasing region 18 of the laser of FIG. 2(e) in accordance with the present invention is thin, for example, 0.06 μm, which is much thinner than that of the oblique lasing region 8 of the prior proposed laser of FIG. 1. Such thin lasing region not only enables lasing with stable fundamental mode but also lasing with a laser beam of small divergence.

Figures 5A, 5B, 5C:
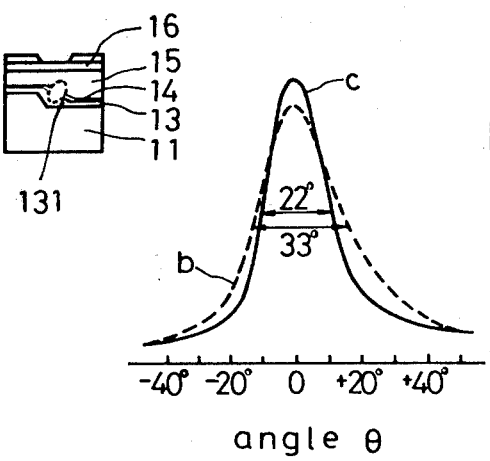
FIG. 5(a) is a graph comparatively showing beam divergences in a plane perpendicular to active junctions of the semiconductor lasers of FIG. 5(b) and FIG. 5(c), respectively.

FIG. 5(a) is a graph showing beam divergence curves b and c for a 770 nm laser of FIG. 5(b) in accordance with the prior proposed invention (dotted line curve) where the first clad layer 13 is grown from a supersaturated Ga-solution, and for a present invention 770 nm laser of FIG. 5(c) where the first clad layer 13 is grown from an exactly saturated Ga-solution. The graph shows relative light intensities of far field patterns of the laser beams, wherein the abscissa is graduated with angle from the light axis of the laser on a plane which is perpendicular to the active junction of the lasers, and the ordinate is graduated with relative light intensities. The curves show that angles of full width at half power is as narrow as 22° for the semiconductor laser in accordance with the present invention, in comparison with 33° C. for that of the prior proposed device. Generally speaking, it is well known that the far field pattern of the laser beam of a semiconductor laser is an eclipse having the longer axis in a direction perpendicular to the active plane, and that a laser beam having a section of a circle is more advantageous than that of the ecliptic section in handling, in various apparatus using the laser beam. The semiconductor laser in accordance with the present invention having thinner lasing region can lase a laser beam with a far field pattern which is almost circular as shown by FIG. 5(c), contrary to the prior proposed terrace type laser having ecliptic far field pattern as shown by FIG. 5(b).

What is claimed is:

1. In a semiconductor laser, the improvement comprising a terrace-shaped semiconductor substrate having an upper face, a lower face and a step part disposed between said upper face and said lower face, a clad layer formed on said substrate includes an upper part, a lower part and a central part, said upper part being on said upper face, said lower part being on said lower face, and said central part connecting said upper and lower parts and being thicker than said upper part and said lower part in a manner that a step-shaped downward bending surface of said central part is located above said lower face, an active layer formed on said clad layer includes an upper lateral part, a lower lateral part, a center part connecting said upper and said lower lateral parts, a lasing region being a part of said upper lateral part near a bending part on said step-shaped downward-bending surface, and a current injection electrode is disposed above said lasing region.

2. A structure in accordance with claim 1, wherein said upper face and said lower face are (100) plane and a face of said step part is of (011) plane.

3. A structure in accordance with claim 1, wherein said lasing region is defined as between said bending part and a position above the upper end of said step part.

4. A structure in accordance with claim 1, wherein said substrate is of GaAs, said clad layer and said active layer are of GaAlAs.

* * * * *